United States Patent
Kriebernegg

(10) Patent No.: US 9,835,668 B2
(45) Date of Patent: Dec. 5, 2017

(54) CIRCUIT ARRANGEMENT FOR SHORT-CIRCUIT DETECTION IN DIODES, LIGHTING ARRANGEMENT AND METHOD THEREFOR

(71) Applicant: ams AG, Unterpremstätten (AT)

(72) Inventor: Josef Kriebernegg, Graz (AT)

(73) Assignee: AMS AG, Unterpremstaetten (AT)

( * ) Notice: Subject to any disclaimer, the term of this patent is extended or adjusted under 35 U.S.C. 154(b) by 244 days.

(21) Appl. No.: 14/352,048

(22) PCT Filed: Sep. 21, 2012

(86) PCT No.: PCT/EP2012/068689
§ 371 (c)(1),
(2) Date: Apr. 15, 2014

(87) PCT Pub. No.: WO2013/056940
PCT Pub. Date: Apr. 25, 2013

(65) Prior Publication Data
US 2014/0266218 A1    Sep. 18, 2014

(30) Foreign Application Priority Data

Oct. 17, 2011  (DE) .......................... 10 2011 116 231

(51) Int. Cl.
*G01R 31/02* (2006.01)
*H05B 33/08* (2006.01)
*G01R 31/26* (2014.01)

(52) U.S. Cl.
CPC ....... *G01R 31/025* (2013.01); *G01R 31/2635* (2013.01); *H05B 33/0887* (2013.01)

(58) Field of Classification Search
CPC ......... H05B 37/00; G01R 31/44; G01R 31/00
See application file for complete search history.

(56) References Cited

U.S. PATENT DOCUMENTS 5,465,041 A * 11/1995 Sanders .................... G05F 1/46
                                                  323/312
7,550,934 B1    6/2009 Deng et al.
(Continued)

FOREIGN PATENT DOCUMENTS

CH      607045 A5    11/1978
DE      26711 A      1/1964
(Continued)

OTHER PUBLICATIONS

"6-Channel LED Controller with Fault Diagnostics for Large Panel LED Backlighting", CAT4026/D Datasheet, Semiconductor Components Industries, LLC, 2010, Nov. 2010, Rev. 4, pp. 1-14.

*Primary Examiner* — Giovanni Astacio-Oquendo
*Assistant Examiner* — Alvaro Fortich
(74) *Attorney, Agent, or Firm* — McDermott Will & Emery LLP

(57) ABSTRACT

A circuit arrangement comprises a first terminal for connection to a voltage source, a second terminal for connection to a first current sink and a third terminal for supplying a potential signal. A first diode string can be connected to the voltage source on the anode side and to the first current sink on the cathode side. The third terminal can be coupled to the cathode side of the first diode string by a resistor. An adjustable reference current sink is coupled to the third terminal, for generating a reference current, and comparison unit coupled to the third terminal on the input side for providing a short-circuit detection signal in dependence on a difference between the potential signal and an adjustable reference voltage. The potential signal can be supplied in dependence on a first short-circuit voltage across the first diode string and in dependence on the reference current.

6 Claims, 1 Drawing Sheet

(56) References Cited

U.S. PATENT DOCUMENTS

| | | | |
|---|---|---|---|
| 7,675,245 B2* | 3/2010 | Szczeszynski | G05F 1/46 315/185 S |
| 7,675,246 B2* | 3/2010 | Chiang | H05B 33/0815 315/291 |
| 8,027,132 B2* | 9/2011 | Omaru | H02H 7/1225 361/93.1 |
| 8,593,149 B2* | 11/2013 | Zhang | H05B 33/0893 324/414 |
| 2006/0055390 A1* | 3/2006 | Nuebling | H02M 1/08 323/311 |
| 2007/0096746 A1* | 5/2007 | Telefont | G01R 31/2635 324/500 |
| 2007/0188112 A1 | 8/2007 | Kang et al. | |
| 2009/0225021 A1* | 9/2009 | Ye | G09G 3/006 345/102 |
| 2010/0007216 A1* | 1/2010 | Chojecki | H03K 17/0822 307/115 |
| 2010/0049454 A1* | 2/2010 | Irissou | H05B 33/0893 702/58 |
| 2010/0194299 A1* | 8/2010 | Ye | H05B 33/0827 315/192 |
| 2010/0289519 A1* | 11/2010 | Huang | G01R 31/2635 324/762.07 |
| 2010/0289982 A1* | 11/2010 | Akiyama | G09G 3/342 349/61 |
| 2011/0068712 A1* | 3/2011 | Young | H05B 33/0815 315/307 |
| 2011/0148314 A1* | 6/2011 | Lin | H05B 33/0827 315/192 |
| 2011/0279133 A1* | 11/2011 | Harper | G01R 19/0092 324/691 |
| 2013/0033321 A1* | 2/2013 | Lindstrand | H03F 1/523 330/253 |
| 2014/0139227 A1* | 5/2014 | Iwakiri | H05B 33/0815 324/414 |

FOREIGN PATENT DOCUMENTS

| | | |
|---|---|---|
| DE | 69525437 T2 | 8/2002 |
| DE | 102008035325 A1 | 3/2009 |
| DE | 102010002081 A1 | 8/2011 |
| EP | 0723162 A1 | 7/1996 |
| EP | 1788695 A1 | 5/2007 |

* cited by examiner

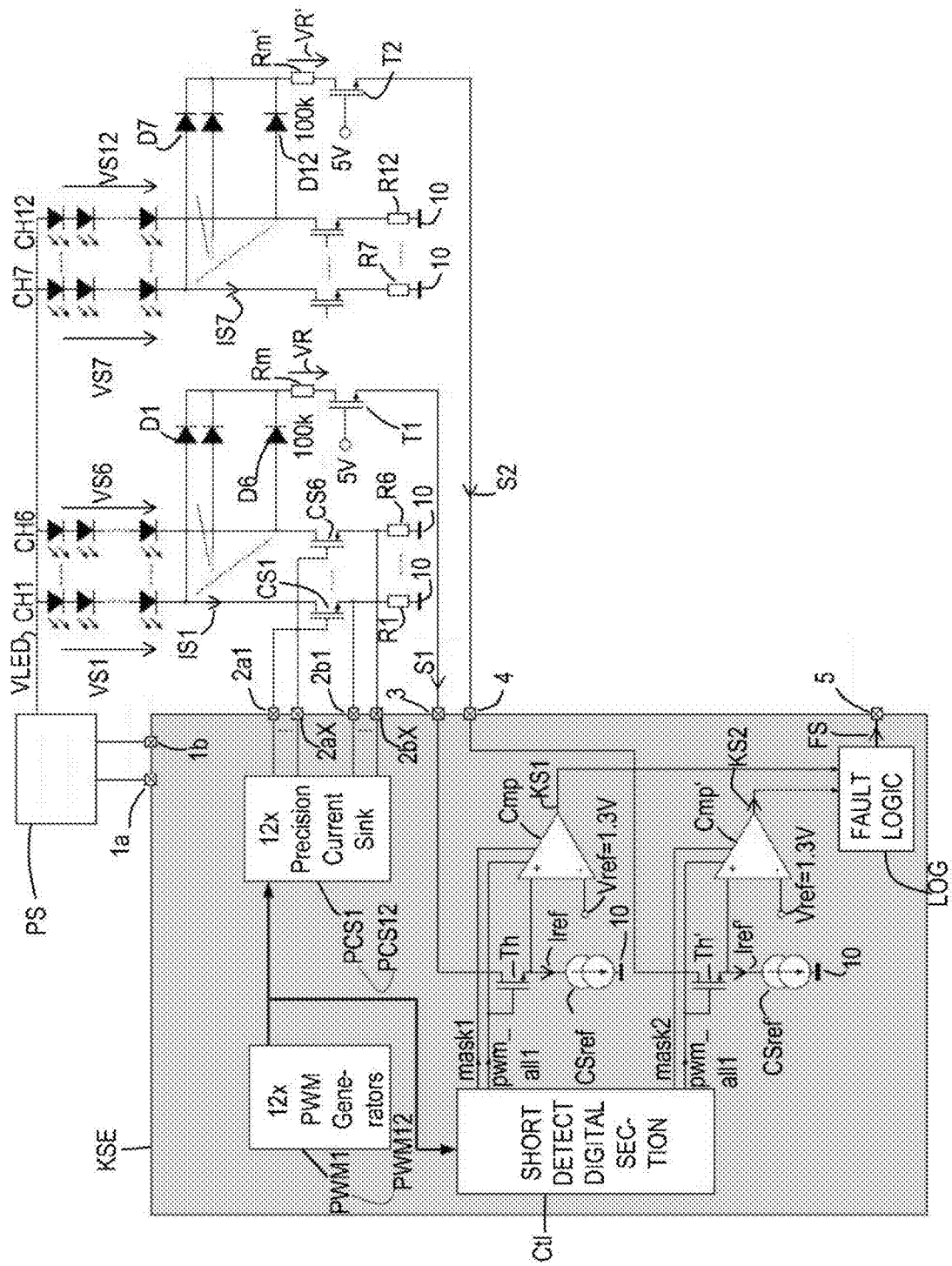

CIRCUIT ARRANGEMENT FOR SHORT-CIRCUIT DETECTION IN DIODES, LIGHTING ARRANGEMENT AND METHOD THEREFOR

The invention pertains to a circuit arrangement for the short-circuit detection in diodes, a lighting arrangement and a method for detecting a short circuit in diodes.

Diodes in the form of light-emitting diodes or LEDs are typically utilized as backlighting of liquid crystal displays or LCDs such as, for example, television sets or monitors. A current flowing through such LEDs is controlled by a current sink. This current sink is essentially formed by a transistor that is implemented in bipolar technology or MOS technology or in the form of a so-called bipolar junction transistor. In case of a short circuit of an LED, the voltage drop across this current sink transistor increases and elevates the released power dissipation. Consequently, this transistor is at risk of overheating that can ultimately lead to the total destruction of the transistor. In order to prevent such overheating, it is necessary to detect a short circuit of an LED.

The present invention starts out from a circuit in which a cathode terminal of an LED to be monitored for a short circuit is connected to a terminal for the short-circuit detection via a Zener diode. As soon as the breakdown voltage of the Zener diode is exceeded, a current flows across this terminal and indicates the short circuit. In this case, the level of the voltage at which a short circuit is detected is directly dependent on the breakdown voltage of the Zener diode. In order to change this level, e.g., for another application, it is therefore required to solder another Zener diode into the circuit. This requires additional effort and cannot be realized during the operation of the circuit.

An objective therefore can be seen in further improving the detection of a short circuit in diodes.

This objective is attained with the subject-matter of the independent claims. Enhancements and embodiments form the subject-matter of the dependent claims.

In one embodiment, a circuit arrangement for short-circuit detection in diodes comprises a first terminal for connection to a voltage source, a second terminal for connection to a first current sink, a third terminal for supplying a potential signal, an adjustable reference current sink for generating a reference current and a comparison unit. A first diode string can be connected to the voltage source on the anode side and to the first current sink on the cathode side. The third terminal can be coupled to the first diode string on the cathode side by means of a resistor. The potential signal can be supplied in dependence on a first short-circuit voltage across the first diode string and in dependence on the reference current. The adjustable reference current sink is coupled to the third terminal. The comparison unit is coupled to the third terminal on its input side and is designed for providing a short-circuit detection signal in dependence on a difference between the potential signal and an adjustable reference voltage.

A short circuit in the diode string leads to a short-circuit voltage that manifests itself in the potential signal. The comparison unit provides the short-circuit detection signal in dependence on the difference between the potential signal and the adjustable reference voltage.

The disclosed circuit arrangement advantageously enables easy adjustment of a limiting value of the voltage dropping across the diode string, at which a short circuit should be detected, namely by means of the adjustable reference current sink and the adjustable reference voltage. It is therefore no longer required to exchange components.

A diode string comprises a series circuit of diodes. The diodes accordingly are interconnected in such a way that a cathode terminal of one diode is connected to the anode terminal of the next diode in the series circuit. The diodes consist, for example, of light-emitting diodes.

In one enhancement, the reference current sink is designed for generating the reference current that leads to an adjustable voltage drop at the resistor in dependence on the short-circuit voltage when a short circuit occurs in the first diode string.

The short-circuit detection signal is provided by the comparison unit as soon as the short-circuit voltage at the first diode string exceeds the sum of the adjustable voltage drop at the resistor and the value of the reference voltage.

The voltage drop at the resistor can be adjusted by means of the reference current. If so required, this voltage drop can be varied in accordance with the respective application.

A short circuit in a diode string occurs when at least one of the diodes of the diode string has a short circuit. The voltage dropping across the diode string in this case is the short-circuit voltage.

In the present circuit arrangement, the reference current sink and the adjustable reference voltage make it possible to easily determine whether only one diode of the diode string has a short circuit or several diodes have a short circuit.

In one embodiment, a lighting arrangement comprises an above-described circuit arrangement, as well as the voltage source, the first current sink, the first diode string and the resistor. The voltage source is connected to the first terminal of the circuit arrangement. The first current sink is connected to the second terminal of the circuit arrangement. The first diode string is coupled to the voltage source on the anode side and to the first current sink on the cathode side. The resistor is connected to the third terminal of the circuit arrangement on the one hand and to the cathode side of the first diode string on the other hand. The potential signal is supplied in dependence on the first short-circuit voltage at the first diode string and in dependence on the reference current.

The first reference current sink generates a defined voltage drop at the resistor. When a short circuit occurs in the first diode string, the short-circuit voltage dropping across the first diode string is higher than the voltage drop at the resistor plus the adjustable reference voltage. The comparison unit consequently generates the short-circuit detection signal.

Due to the utilization of the adjustable reference current sink in connection with the adjustable reference voltage and the resistor, the level of the voltage at which a short circuit is detected can be advantageously varied without exchanging a component. It is possible to implement a broad voltage range in which a short circuit is detected. In addition, it is more cost-efficient to utilize the resistor than a Zener diode of the described conventional circuit.

The first diode string is interconnected in such a way that the anode terminal of the first diode of the string is connected to the voltage source and the cathode terminal of the last diode of the string is coupled to the first current sink.

A current sink may also be referred to or implemented as a current source, but with particular consideration of the current direction is referred to as a current sink in this application.

In one enhancement, the lighting arrangement comprises a second diode string, a second current sink, as well as a first and a second coupling diode. The second diode string is connected to the voltage source on the anode side. The second current sink is coupled to the circuit arrangement and to the cathode side of the second diode string. The first coupling diode is connected to the cathode side of the first diode string on the anode side and to the resistor on the cathode side. The second coupling diode is connected to the cathode side of the second diode string on the anode side and to the resistor on the cathode side. The potential signal is supplied to the third terminal of the circuit arrangement also in dependence on a second short-circuit voltage across the second diode string. The reference current sink is additionally designed for generating the reference current that leads to the adjustable voltage drop at the resistor when a short circuit occurs in the first and/or second diode string.

A short circuit in the first and/or second diode string leads to a first and/or second short-circuit voltage in the respective diode string. Since the connection of the diode strings by means of the first and the second coupling diode corresponds to a logical OR operation, the voltage drop that manifests itself in the potential signal is generated at the common resistor. The comparison unit generates the short-circuit detection signal by comparing the potential signal to the adjustable reference voltage.

In this way, an arbitrary number of diode strings can be coupled in the form of a parallel circuit by means of a respective coupling diode with the aid of the resistor and subjected to a short-circuit detection. The number of diode strings that are connected in parallel depends on the desired accuracy of the short-circuit detection. If just one diode string is connected to the comparison unit by means of the resistor, a short circuit can be exactly localized with the aid of the short-circuit detection signal. The concerned diode string can subsequently be switched off.

The voltage source is implemented, for example, in the form of a switched voltage source or in the form of a DC/DC converter.

In another embodiment, a cascode transistor is provided and connected between the resistor and the third terminal of the circuit arrangement, wherein said cascode transistor is designed for limiting a voltage at the third terminal.

The cascode transistor is jointly utilized by the connected diode strings and is driven, for example, with a certain level of its gate voltage such that the voltage at the third terminal of the circuit arrangement also does not exceed a certain desired value in case of a short circuit.

In this way, the third terminal of the circuit arrangement is advantageously protected from an overvoltage.

In an enhancement, the comparison unit can be switched on in dependence on a drive of all connected diode strings.

The comparison unit is only switched on in order to determine the short-circuit detection signal if all diode strings coupled thereto are also switched on.

The comparison unit comprises at least one comparator.

In another embodiment, the comparison unit can be switched on with a defined time delay.

Consequently, the comparison unit is preferably only switched on after switching on the diode strings coupled thereto. This prevents a false detection of a short circuit due to voltage peaks when the diode strings are switched on.

In an enhancement, the lighting arrangement comprises one respective precision current sink and one respective signal generator for each diode string. Each precision current sink is respectively assigned and coupled to a current sink of a diode string. Each signal generator is respectively connected to a precision current sink such that the latter can be driven in a time-controlled fashion.

Consequently, one precision current sink and one signal generator are respectively provided for each diode string of the lighting arrangement. Each precision current sink controls the current sink of the diode string with the aid of the signal generator.

For example, the signal generator provides pulse-width modulated signals or PWM signals.

MOS transistors or bipolar transistors are used to implement a current sink.

In one embodiment, a method for detecting a short circuit in diodes comprises the following steps:
supplying a supply voltage and a control current to a diode string,
supplying an adjustable reference current,
generating a potential signal in dependence on a short-circuit voltage of the diode string and in dependence on the reference current, wherein the diode string is operated with the supply voltage and the control current, and
providing a short-circuit detection signal in dependence on a difference between the potential signal and an adjustable reference voltage.

Since the short-circuit detection signal is provided in dependence on the potential signal that is generated in dependence on an occurring short-circuit voltage and as a function of the adjustable reference current, it is easily possible to adjust the voltage level at which a short circuit should be detected. The adaptation of this voltage level is realized by adjusting the level of the reference current.

An embodiment example of the invention is described in greater detail below with reference to the drawing. Components and circuit elements with respectively identical function or operation are identified by the same reference symbols.

In the drawing:
FIG. 1 shows an embodiment example of a lighting arrangement according to the proposed principle.

FIG. 1 shows an embodiment example of a lighting arrangement according to the proposed principle. In this case, the lighting arrangement is realized, for example, with twelve diode strings. The lighting arrangement comprises a circuit arrangement KSE according to the proposed principle, as well as a voltage source PS, twelve diode strings CH1 to CH12, twelve coupling diodes D1 to D12, twelve current sinks CS1 to CS12, a resistor Rm, an additional resistor Rm', a cascode transistor T1 and an additional cascode transistor T2.

Each diode string CH1 to CH12 respectively comprises a series circuit of several light-emitting diodes that are connected in a rectified fashion. The voltage source PS is connected to a first terminal 1a, 1b of the circuit arrangement KSE. In addition, the voltage source PS is connected to the respective anode side of each diode string CH1 to CH12 in order to deliver a supply voltage VLED to the respective diode strings CH1 to CH12. The cathode side of each diode string CH1 to CH12 is respectively coupled to a current sink CS1 to CS12 assigned to this diode string. Each current sink CS1 to CS12 is respectively coupled to an assigned second terminal 2aX, 2bX of the circuit arrangement KSE. In this case, X represents a number between 1 and 12. Each second terminal 2aX, 2bX of the circuit arrangement KSE is respectively realized in the form of a two-part terminal. Consequently, a second terminal 2aX, 2bX is provided on the circuit arrangement KSE for each connected current sink CSX. Each current sink CSX is realized, for example, in the form of a transistor, as illustrated in the FIGURE. The gate terminal and the source terminal of the current sink transistor therefore are respectively connected to the circuit arrangement KSE by means of the second terminal 2aX, 2bX. In addition, the current sink CSX is connected to a reference potential terminal 10 by means of an assigned current sink resistor RX.

Consequently, the diode strings CH1 to CH12 are respectively operated by the circuit arrangement KSE in the form of a parallel circuit with a separate current sink CSX with the aid of the voltage source PS.

Six diode strings respectively form a group and are respectively connected to the third or fourth terminal 3, 4 of the circuit arrangement KSE by means of a respectively assigned coupling diode DX, the respective resistor or additional resistor Rm, Rm' and the respective cascode transistor T1 or additional cascode transistor T2 in order to detect a short circuit. The diode strings CH1 to CH6 form a first group that is connected to the circuit arrangement KSE via the third terminal 3. The diode strings CH7 to CH12 form a second group that is connected to the circuit arrangement KSE via the fourth terminal 4.

Each coupling diode DX is connected to the cathode terminal of the last diode of the assigned diode string CHX. The cathode terminals of the coupling diodes D1 to D6 of the first group are jointly connected to the resistor Rm. The cathode terminals of the coupling diodes D7 to D12 of the second group are jointly connected to the additional resistor Rm'. A parallel circuit of the coupling diodes D1 to D6, as well as a parallel circuit of the coupling diodes D7 to D12, is respectively also referred to as a diode array.

Each diode string CHX is operated with the supply voltage VLED and a control current ISX that is generated by the assigned current sink CSX. A short-circuit voltage VSX drops at each concerned diode string CHX in case of a short circuit of one or more of its diodes. Due to the division of the diode strings CHX into two groups, as illustrated in the embodiment example in the drawing, a potential signal S1 is generated in the first group of diode strings CH1 to CH6 and delivered to the third terminal 3 of the circuit arrangement KSE. An additional potential signal S2 is generated in the second group that comprises the diode strings CH7 to CH12 and is delivered to the fourth terminal 4 of the circuit arrangement KSE.

The circuit arrangement KSE comprises a comparison unit Cmp, an additional comparison unit Cmp', a reference current sink CSref, an additional reference current sink CSref', twelve precision current sinks PCS1 to PCS12, twelve signal generators PWM1 to PWM12, a control unit Ctl and a fault logic LOG. Each precision current sink PCSX is coupled to the respective current sink CSX of the assigned diode string CHX by means of the respective second terminal 2aX, 2bX of the circuit arrangement KSE. Each signal generator PWMX is coupled to an assigned precision current sink PCSX in order to drive the latter in a time-controlled fashion. In addition, each signal generator PWMX is connected to the control unit Ctl.

The comparison unit Cmp is connected to the third terminal 3 of the circuit arrangement KSE by means of an auxiliary transistor Th. Furthermore, an input of the comparison unit Cmp is connected to the reference current sink CSref. The reference current sink CSref is connected to the reference potential terminal 10 with its other terminal and provides an adjustable reference current Iref. The additional comparison unit Cmp' is connected to the fourth terminal 4 of the circuit arrangement KSE by means of an additional auxiliary transistor Th'. Furthermore, an input of the additional comparison unit Cmp' is connected to the additional reference current sink CSref'. This additional reference current sink CSref' is connected to the reference potential terminal 10 with its other terminal and provides an additional adjustable reference current Iref'. An adjustable reference voltage Vref is also supplied to each comparison unit Cmp, Cmp'. A short-circuit detection signal KS1 is provided at the output of the comparison unit Cmp and is delivered to the fault logic LOG. An additional short-circuit detection signal KS2 is provided at an output of the additional comparison unit Cmp' and is likewise delivered to the fault logic LOG.

The fault logic LOG generates a fault signal FS that is provided at a fifth terminal 5 of the circuit arrangement KSE by combining the delivered short-circuit detection signals KS1, KS2 in a logical operation such as, for example, a logical OR operation.

Each signal generator PWMX generates a drive signal for the assigned diode string CHX that controls the assigned precision current sink PCSX. This precision current sink PCSX in turn operates the transistor of the assigned current sink CSX.

The control unit Ctl provides additional signals for driving the comparison units Cmp, Cmp'. These are the signals pwm_all1, pwm_all2, mask1 and mask2. The unit control Ctl generates the signal pwm_all1 from the signals that are provided by the signal generators PWM1 to PWM12. In this way, for example, the drive signals used for driving the diode strings CH1 to CH6 in the first group are combined into the signal pwm_all1. The drive signals of the second group that comprises the diode strings CH7 to CH12 are combined, for example, into the signal pwm_all2. The signal mask1 implements a time delay with respect to the signal pwm_all1. The signal mask2 implements a time delay with respect to the signal pwm_all2. In this way, the comparison units Cmp and Cmp' that are respectively realized, for example, in the form of a comparator only provide a short-circuit detection signal KS1, KS2 if the diode strings that are respectively assigned to these comparison units are actually switched on.

When a short circuit occurs in a diode string CHX of the first or second group, a voltage at the concerned diode string CHX increases to the short-circuit voltage VSX. Due to the short-circuit voltage VSX, adjustable voltage drops VR and VR' caused by the reference current Iref and the additional reference current Iref' are respectively generated at the respective resistor RM or RM' of the corresponding group. This manifests itself in the respectively assigned potential signal S1 or S2. As soon as the potential signal S1 or S2 exceeds the value of the reference voltage Vref, the output of the corresponding comparator of the respective comparison unit Cmp or Cmp' switches and thus generates the short-circuit detection signal KS1 and/or KS2. The fault signal FS at the output 5 indicates a short circuit. The group with the short circuit can subsequently be switched off. The transistor of the current sink CSX in the concerned diode string CHX is prevented from overheating.

In an example, the reference voltage is adjusted to 1.3 V, wherein the value of the reference current Iref and the value of the additional reference current Iref' respectively amounts to 100 µA. The value of the resistor and the value of the additional resistor respectively amount to 100 kiloohm. When a short circuit occurs, for example, in the first diode string CH1, the first short-circuit voltage VS1 increases, for example, to 12.1 V. A voltage drop VR of 10 V is generated at the resistor RM by the reference current Iref. With consideration of a voltage drop of 0.7 V at the coupling diode D1, the potential signal S1 consequently has a voltage value of approximately 1.4 V. Since this value is higher than that of the reference voltage Vref, the output of the comparison unit Cmp switches and indicates a short circuit with this pulse in the short-circuit detection signal KS1.

The voltage level at which a short circuit is detected can be advantageously adjusted with the respective level of the reference current Iref or the additional reference current Iref' and the reference voltage Vref. It is not necessary to exchange a component. In addition, a more cost-efficient solution than the initially described circuit with a Zener diode is realized due to the utilization of the resistor Rm, Rm'.

The utilization of the described circuit arrangement KSE and the lighting arrangement is particularly advantageous when using current sinks CSX that are respectively implemented in the form of a transistor, as illustrated in the drawing, wherein the drain or collector terminal of said transistor is not directly connected to the circuit arrangement KSE. This type of implementation requires fewer terminals of the circuit arrangement KSE. This is the reason why the drain terminals or collector terminals of the transistors of the current sinks CSX that need to be monitored for short circuits are connected by means of the respective diode array that either comprises the coupling diodes D1 to D6 or the coupling diodes D7 to D12. The respectively occurring short-circuit voltage VSX is transmitted to the third or the fourth terminal 3, 4 of the circuit arrangement KSE by means of the resistor Rm or the additional resistor Rm' and the corresponding cascode transistor T1 or T2.

LIST OF REFERENCE SYMBOLS 1a, 1b, 2a1, 2b1 Terminal
3, 4, 5, 10 Terminal
Cmp, Cmp' Comparison unit
KSE Circuit arrangement
Ctl Control unit
Log Fault logic
Ks1, KS2, S1, S2, FS Signal
CSref, CSref', CS1, . . . , CS12 Current sink
PCS1, . . . , PCS12 Precision current sink
PWM1, . . . , PWM12 Signal generator
Th, Th' Auxiliary transistor
Iref, Iref', IS1, . . . , IS12 Current
VS1, . . . , VS12 Short-circuit voltage
R1, . . . , R12, Rm, Rm' Resistor
CH1, . . . , CH12 Diode string
D1, . . . , D12 Coupling diode
VR, VR' Voltage
PS Voltage source
T1, T2 Cascode transistor
mask1, mask2 Signal
pwm_all1, pwm_all2 Signal

The invention claimed is:

1. A lighting arrangement comprising:
a circuit arrangement (KSE) for short-circuit detection in diodes, the circuit arrangement (KSE) comprising:
 a first terminal (1a, 1b) for connection to a voltage source (PS);
 a second terminal (2aX, 2bX) for connection to a first current sink (CS1);
 a third terminal (3) for supplying a potential signal (S1), wherein a first diode string (CH1) can be connected to the voltage source (PS) on the anode side and to the first current sink (CS1) on the cathode side, and wherein the third terminal (3) can be coupled to the cathode side of the first diode string (CH1) by means of a resistor (Rm);
 an adjustable reference current sink (CSref) that is coupled to the third terminal (3) and designed for generating a reference current (Iref); and
 a comparison unit (Cmp) that is coupled to the third terminal (3) on its input side and is designed for providing a short-circuit detection signal (KS1) in dependence on a difference between the potential signal (S1) and an adjustable reference voltage (Vref), wherein the potential signal (S1) can be supplied in dependence on a first short-circuit voltage (VS1) across the first diode string (CH1) and in dependence on the reference current (Iref);
the voltage source (PS) that is connected to the first terminal (1a, 1b) of the circuit arrangement (KSE);
the first current sink (CS1) that is connected to the second terminal (2a, 2b) of the circuit arrangement (KSE);
the first diode string (CH1) that is coupled to the voltage source (PS) on the anode side and to the first current sink (CS1) on the cathode side, wherein the first diode string (CH1) comprises one respective precision current sink (PCS1) that is respectively assigned and coupled to the current sink (CS1) of the diode string (CH1), and one respective signal generator (PWM1) that is respectively coupled to a precision current sink (PCS1) such that the latter can be driven in a time-controlled manner; and
the resistor (Rm) that is connected to the third terminal (3) and to the cathode side of the first diode string (CH1), wherein the potential signal (S1) is supplied in dependence on the first short-circuit voltage (VS1) across the first diode string (CH1) and in dependence on the reference current (Iref).

2. The lighting arrangement according to claim 1, wherein the reference current sink (CSref) is designed for generating the reference current (Iref) that leads to an adjustable voltage drop (VR) at the resistor (Rm) in dependence on the short-circuit voltage (VS1) when a short circuit occurs in the first diode string (CH1).

3. The lighting arrangement according to claim 2, further comprising:
a second diode string (CH6) that is connected to the voltage source (PS) on the anode side;
a second current sink (CS6) that is coupled to the circuit arrangement (KSE) and to the cathode side of the second diode string (CH6);
a first coupling diode (D1) that is connected on the anode side to the cathode side of the first diode string (CH1) and is connected to the resistor (Rm) on the cathode side; and
a second coupling diode (D6) that is connected on the anode side to the cathode side of the second diode string (CH6) and is connected to the resistor (Rm) on the cathode side,
wherein the potential signal (S1) is supplied to the third terminal (3) of the circuit arrangement (KSE) also in dependence on a second short-circuit voltage (VS6) across the second diode string (CH6), and
wherein the reference current sink (CSref) is also designed for generating the reference current (Iref) that leads to the adjustable voltage drop (VR) at the resistor (Rm) when a short circuit occurs in the first and/or second diode string (CH1, CH6).

4. The lighting arrangement according to claim 1, wherein a cascode transistor (T1) is provided and connected between the resistor (Rm) and the third terminal (3) of the circuit arrangement (KSE), and wherein said cascode transistor (T1) is designed for limiting a voltage at the third terminal (3).

5. The lighting arrangement according to claim 1, wherein the comparison unit (Cmp) can be switched on in dependence on a drive of all diode strings (CH1, CH6).

6. The lighting arrangement according to claim 5, wherein the comparison unit (Cmp) can be switched on with a defined time delay.

* * * * *